United States Patent
Sonoda et al.

(10) Patent No.: US 7,589,481 B2
(45) Date of Patent: Sep. 15, 2009

(54) CONTROL DEVICE INTEGRATED DYNAMO-ELECTRIC MACHINE

(75) Inventors: Isao Sonoda, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/651,598

(22) Filed: Jan. 10, 2007

(65) Prior Publication Data

US 2007/0188119 A1    Aug. 16, 2007

(30) Foreign Application Priority Data

Jan. 16, 2006    (JP)    ............... 2006-007619

(51) Int. Cl.
*H02P 1/54*    (2006.01)
(52) U.S. Cl. ............ 318/34; 318/400.26; 318/801; 363/40; 363/56.01; 363/98; 363/141; 363/174; 310/10; 310/52; 310/63
(58) Field of Classification Search ......... 318/254, 318/34, 72, 400.26, 694, 801; 62/228.4; 310/10, 52, 63; 361/274.2, 274.3; 363/40, 363/56.01, 98, 102, 120, 141, 150, 174
See application file for complete search history.

(56) References Cited

U.S. PATENT DOCUMENTS

| | | | | |
|---|---|---|---|---|
| 5,990,590 | A * | 11/1999 | Roesel et al. ............... 310/113 |
| 6,166,937 | A * | 12/2000 | Yamamura et al. .......... 363/141 |
| 6,201,365 | B1 * | 3/2001 | Hara et al. ................... 318/558 |
| 6,262,906 | B1 * | 7/2001 | Salzmann et al. ........... 363/141 |
| 6,323,613 | B1 * | 11/2001 | Hara et al. ................... 318/471 |
| 6,356,043 | B2 | 3/2002 | Baum |
| 6,529,394 | B1 * | 3/2003 | Joseph et al. ................ 363/141 |
| 6,914,357 | B2 * | 7/2005 | Tabatowski-Bush et al. .. 310/71 |
| 6,992,409 | B2 * | 1/2006 | Torii et al. .................... 310/52 |
| 7,031,156 | B2 * | 4/2006 | Naiva et al. .................. 361/695 |
| 7,082,905 | B2 * | 8/2006 | Fukuda et al. ............ 123/41.31 |
| 7,207,187 | B2 * | 4/2007 | Funahashi et al. .......... 62/228.4 |
| 7,268,441 | B2 * | 9/2007 | Asao et al. ............. 318/400.09 |
| 7,362,017 | B2 * | 4/2008 | Piper et al. .................... 310/63 |
| 2004/0020224 | A1 * | 2/2004 | Bash et al. .................. 62/228.4 |
| 2005/0223727 | A1 * | 10/2005 | Funahashi et al. .......... 62/228.4 |
| 2005/0270806 | A1 * | 12/2005 | Zhu ............................. 363/17 |
| 2006/0064998 | A1 * | 3/2006 | Funahashi et al. .......... 62/228.4 |

FOREIGN PATENT DOCUMENTS

| | | |
|---|---|---|
| JP | 64-060244 A | 3/1980 |
| JP | 58-83982 U | 6/1983 |
| JP | 2004-274992 A | 9/2004 |
| JP | 2005-176459 A | 6/2005 |
| JP | 2005-348494 A | 12/2005 |

* cited by examiner

*Primary Examiner*—Bentsu Ro
*Assistant Examiner*—Antony M Paul
(74) *Attorney, Agent, or Firm*—Sughrue Mion, PLLC

(57) ABSTRACT

In order to improve reliability, cost performance, and cooling property, a control device integrated dynamo-electric machine mounted to a dynamo-electric machine includes an inverter bridge configured with a plurality of semiconductor switching elements, and a plurality of heat sinks provided for respective arms of the inverter bridge and having the semiconductor switching elements of the corresponding arms mounted thereon for cooling the mounted semiconductor switching elements, wherein the semiconductor switching element includes a plurality of semiconductor switching devices arranged in parallel, and the plurality of semiconductor switching devices arranged in parallel are mounted on the common heat sinks.

14 Claims, 7 Drawing Sheets

CONTROL DEVICE INTEGRATED DYNAMO-ELECTRIC MACHINE

BACKGROUND OF THE INVENTION

1. Field of the Invention

The present invention relates to a control device integrated dynamo-electric machine to be used on a vehicle or the like and, more specifically, to a control device integrated dynamo-electric machine including an inverter bridge having a plurality of semiconductor switching elements and a heat sink for cooling the semiconductor switching elements provided on the dynamo-electric machine.

2. Description of the Related Art

Recent years, hybrid cars start to appear in view of problems of global warming and resource saving. The hybrid car has a system including a power unit having an engine and a motor combined to each other, and has an idling-stop function to stop engine when the vehicle stops at a red light and, when the light is turned green, restart the engine automatically and quickly with the motor by determining the change of the light from the operation of a brake and an accelerator by a driver, a function to assist acceleration when accelerating the vehicle by the motor according to the state of acceleration to alleviate a load applied to the engine, which is an internal combustion engine. However, this system requires a high-voltage battery and a high-output motor, and hence the system itself costs much.

In contrast, in order to aim the system to be generally familiarized, a system limited to an idling-stop-specific function for reducing the cost is now in development.

As such a system, an inverter-integrated AC motor as disclosed in, for example, JP-A-2004-274992 (see description, FIG. 1 and FIG. 3) is proposed. This system includes an inverter function integrated in an alternator in the related art as a structure, that is, a motor function for starting the engine is added to a power-generating function of the alternator in the related art.

FIG. 10 is a schematic circuit diagram of the control device integrated dynamo-electric machine in the related art showing a relation of connection among a control device provided with a power device unit having an inverter, a dynamo-electric machine, a battery, and so on.

In FIG. 10, a dynamo-electric machine 1 includes an armature winding 16a wound around a stator and a field winding 14 wound around a rotor, and the armature winding 16a is configured by connecting coils of three phases (U-phase, V-phase, and W-phase) into a Y-connection (Star-connection).

A power device unit 4 includes an inverter bridge 40, which is referred to as an inverter module, having a plurality of switching devices (power transistor, MOSFET, IGBT, etc.) 41 as power devices and diodes 42 arranged in parallel with the respective switching devices 41, and a capacitor 43 connected to the inverter bridge 40 in parallel.

The inverter bridge 40 includes three modules, each module including two sets of a switching device 41a and the diode 42 which constitute an upper arm (high-potential arm) 46 and the switching device 41b and the diode 42 which constitute a lower arm (low-potential arm) 47 arranged in series, and the three modules are arranged in parallel corresponding to three phases (U-phase, V-phase and W-phase).

Ends of the respective phases of the Y-connection of the armature winging 16a are electrically connected to midpoints between the switching device 41a of the upper arm 46 and the switching device 41b of the lower arm 47 respectively in the respective phases U, V and W via AC wirings 9.

A positive terminal and a negative terminal of a battery 5 are electrically connected to a positive side and a negative side of the inverter bridge 40 respectively via DC wirings 8. In the inverter bridge 40, the switching operation of the respective switching devices 41a, 41b are controlled by a command from a control circuit 44. The control circuit 44 controls a field current control circuit 45 to adjust a field current to be supplied to the field winding 14 of the rotor.

In the dynamo-electric machine 1 provided with the power device unit 4 as described above, a DC power is distributed from the battery 5 to the power device unit 4 via the DC wirings 8 when the engine is started. Then, the control circuit 44 turns ON and OFF the respective switching devices 41a, 41b of the inverter bridge 40, so that the DC power is converted to a three-phase AC power. Then, the three-phase AC power is supplied to the armature winding 16a of the dynamo-electric machine 1 via the AC wirings 9. Accordingly, a revolving magnetic field is provided in the periphery of the field winding 14 of the rotor being supplied with the field current by the field current control circuit 45, and hence the rotor of the dynamo-electric machine 1 is driven to rotate, whereby the engine is started via a dynamo-electric machine pulley, a belt, a crank pulley, and a clutch (ON).

On the other hand, when the engine is started, the revolving power of the engine is transmitted to the dynamo-electric machine 1 via the crank pulley, the belt, and the dynamo-electric machine pulley. Accordingly, the rotor of the dynamo-electric machine 1 is driven to rotate, and a three-phase AC voltage is induced in the armature winding 16a. Therefore, the control circuit 44 turns ON and OFF the respective switching devices 41 to convert the three-phase AC power induced in the armature winding 16a into the DC power, thereby charging the battery 5.

In the dynamo-electric machine in the related art, the arms in the three-phase circuit which constitute a power unit of the control circuit each include a single semiconductor switching device. Although it depends on the generated current to be used continuously required for a power generator for vehicles and the requirement of an engine torque, it is necessary to supply a current which is at least 1.5 to 2 times the generated current for a short time for starting the engine. Since there is provided only one switching device, there is no flexibility in design according to power generation of the dynamo-electric machine, the current used when being driven, temporal conditions, cooling properties of the dynamo-electric machine, or the configuration of the heat sink, wiring members and so on. Consequently, it is obliged to use the switching device having a useless capacity or a size in terms of design.

Since there is no flexibility in design, if the priority is given to one of the power generation and the driving, it is obliged to reduce the current when the other one is in operation, and hence it becomes hindrance to achievement of high-power.

Since there is only one switching device, the malfunction of the device is directly led to the malfunction of operation of the dynamo-electric machine. Therefore, there remains a problem to be solved in reliability of the dynamo-electric machine.

In addition, there are generally small numbers of alternatives for the discrete multi-purpose devices having a capability of accommodating the current required for the dynamo-electric machine for vehicles as described above by itself. Therefore, it is necessary to develop a new switching device. However, development of the new switching device disadvantageously results in cost increase.

When it is mounted to vehicles such as automotive vehicles, it is also necessary to cope with constraint conditions such as downsizing and weight reduction.

SUMMARY OF THE INVENTION

In view of such circumstances as described above, it is an object of the invention to improve reliability, cost performance and cooling property of a dynamo-electric machine.

A control device integrated dynamo-electric machine according to the invention includes an inverter bridge having a plurality of semiconductor switching elements; and a plurality of heat sinks that are provided for respective arms of the inverter bridge and include the semiconductor switching elements mounted thereto for the corresponding arms for cooling the semiconductor switching elements mounted thereto, the plurality of semiconductor switching elements and the plurality of heat sinks being mounted to the control device integrated dynamo-electric machine, wherein the semiconductor switching elements include a plurality of semiconductor switching devices arranged in parallel, and the plurality of semiconductor switching devices arranged in parallel are mounted to the common heat sinks, whereby reliability, cost performance and cooling property can be advantageously improved.

The foregoing and other object, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
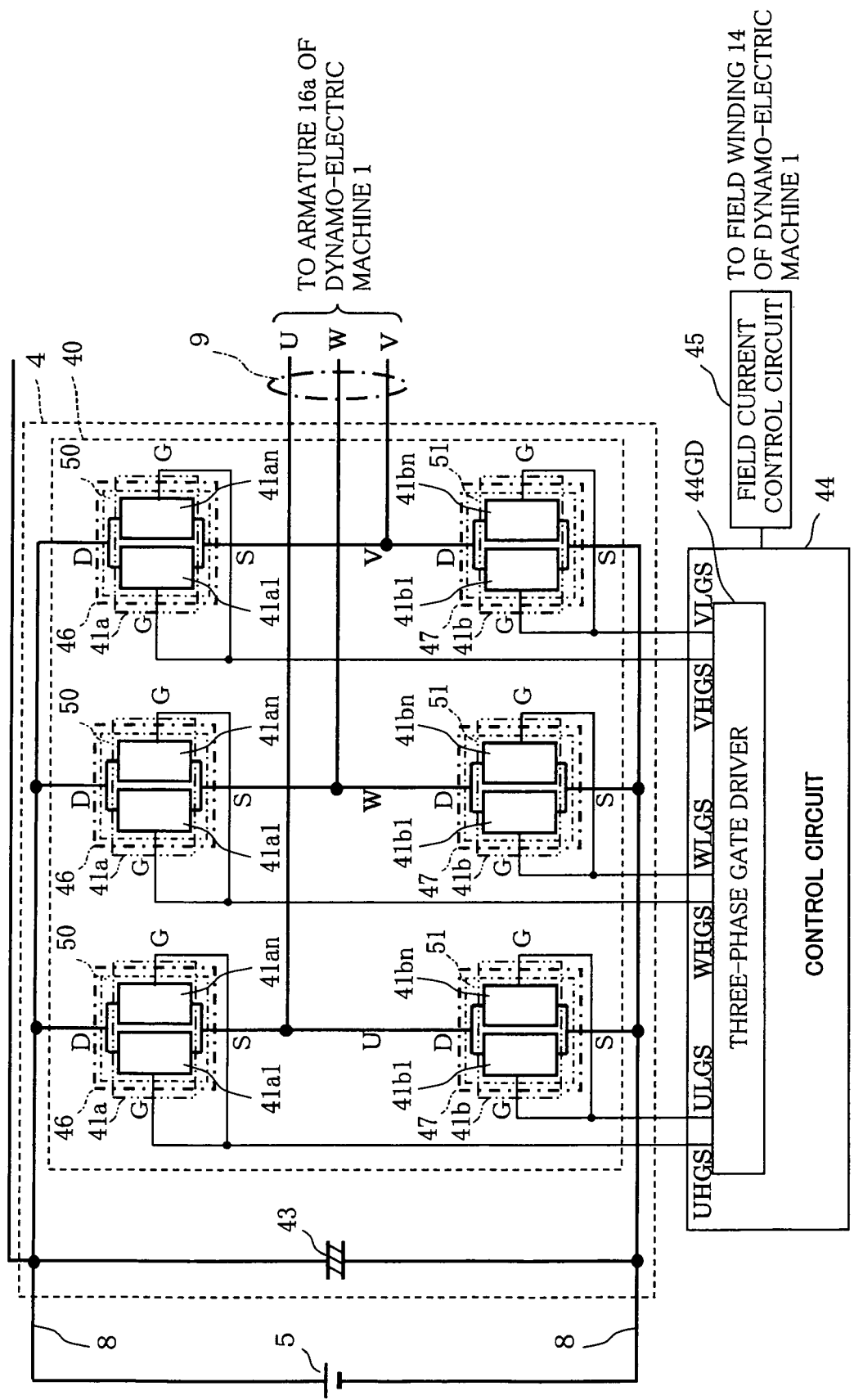
FIG. 1 is a schematic circuit diagram of a control device integrated dynamo-electric machine showing an example of a connecting relation among a control device having a power device unit having an inverter, a dynamo-electric machine, a battery and so on according to a first embodiment of the invention.
Figure 10:
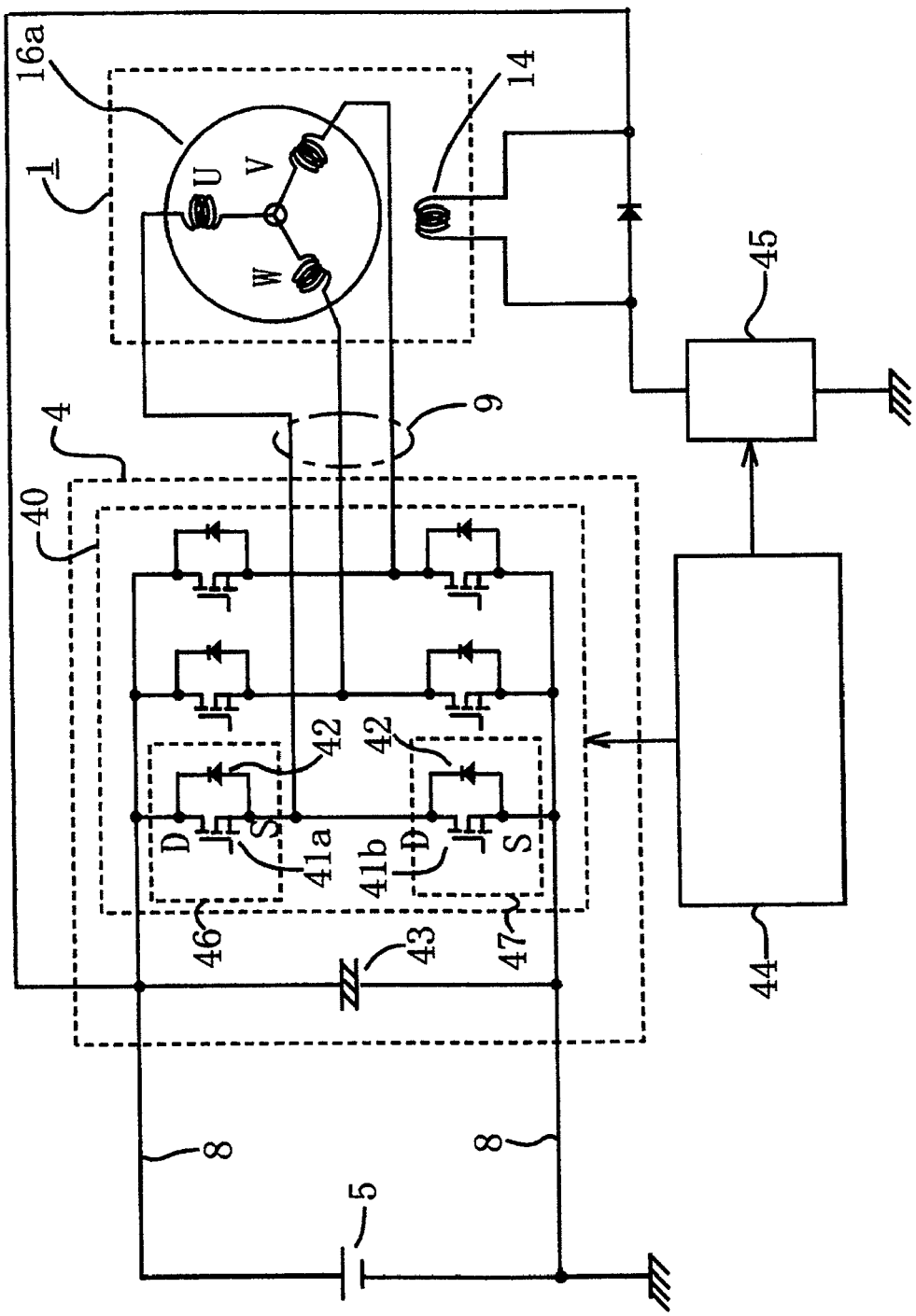
FIG. 10 is a schematic circuit diagram of the control device integrated dynamo-electric machine in the related art, showing a connecting relation among the control device provided with the power device unit having the inverter, the dynamo-electric machine, and the battery.

Referring now to FIG. 1 to FIG. 4, a first embodiment of the invention will be described. In FIG. 1 to FIG. 4, the same parts are represented by the same reference numerals. In FIG. 1, the parts same as or corresponding to the parts in FIG. 10 showing an example of described above are represented by the same reference numerals as in FIG. 10.

Referring now to FIG. 1 showing a schematic circuit diagram of a control device integrated dynamo-electric machine, the circuit configuration and the operation are mainly described.

In FIG. 1, a dynamo-electric machine 1 includes an armature winding 16a wound around a stator and a field winding 14 wound around a rotor, and the armature winding 16a includes three phases (U-shape, V-shape and W-phase) of coils connected into a Y-connection (Star-connection).

A power device unit 4 includes an inverter bridge 40 having a plurality of semiconductor switching elements as power elements and being referred to as "inverter module", and a capacitor 43 connected in parallel to the inverter bridge 40. The inverter bridge 40 exemplified in the first embodiment is a three-phase inverter bridge having upper and lower arms for the respective phases of the U-phase, the V-phase and the W-phase as shown in the drawing.

The inverter bridge 40 is provided with two sets of arms including an upper arm (high-potential arm) 46 having a high-potential semiconductor switching element 41a which includes a plurality of semiconductor switching devices 41a1 and 41an arranged and connected in parallel to each other, and a lower arm (low-potential arm) 47 having a low-potential side semiconductor switching element 41b which includes a plurality of semiconductor switching devices 41b1 and 41bn arranged and connected in parallel to each other, and two set each of arms are connected in parallel for three phases (U-phase, V-phase and W-phase).

The semiconductor switching devices 41a1, 41an, 41b1, 41bn are known semiconductor switching devices such as power transistor, MOSFET, or IGBT, and gate control signals are supplied to each arm. In other words, common gate control signals UHGS are supplied to the plurality of semiconductor switching devices 41a1 and 41an connected in parallel in the upper arm 46 of the U-phase from a three-phase gate driver 44GD of a control circuit 44, and common gate control signals ULGS are supplied to the plurality of semiconductor switching devices 41b1 and 41bn connected in parallel in the lower arm 47 of the U-phase from the three-phase gate driver 44GD.

Likewise, common gate control signals VHGS are supplied to the plurality of semiconductor switching devices 41a1 and 41an connected in parallel in the upper arm 46 of the V-phase from the three-phase gate driver 44GD of the control circuit 44, and common gate control signals VLGS are supplied to the plurality of semiconductor switching devices 41b1 and 41bn connected in parallel in the lower arm 47 of the V-phase from the three-phase gate driver 44GD. Common gate control signals WHGS are supplied to the plurality of semiconductor switching devices 41a1 and 41an connected in parallel in the upper arm 46 of the W-phase from the three-phase gate driver 44GD of the control circuit 44, and the common gate control signals ULGS are supplied to the plurality of semiconductor switching devices 41b1 and 41bn connected in parallel in the lower arm 47 of the W-phase from the three-phase gate driver 44GD.

Although not shown in FIG. 1, the known flywheel diode connected in parallel to the semiconductor switching devices may be configured as a module by integrating with the respective semiconductor switching devices 41a1, 41an, 41b1, 41bn, or may be provided in common instead of providing individually to the plurality of semiconductor switching devices connected in parallel to each other.

The ends of the respective phase of the Y-connection of the armature winding 16a are connected electrically to respective midpoints between the semiconductor switching devices 41a1, 41an of the upper arm 46 and the semiconductor switching devices 41b1, 41bn of the lower arm 47 connected in series in the respective UVW phases via the AC wirings 9.

The positive terminal and the negative terminal of a battery 5 are connected electrically to the positive side and the negative side of the inverter bridge 40 via DC wirings 8. In the inverter bridge 40, the switching operation of the respective semiconductor switching devices 41a1, 41an, 41b1 and 41bn are controlled by a command from the control circuit 44. The control circuit 44 controls a field current control circuit 45 and adjusts a field current flowed to the field winding 14 of the rotor.

In the dynamo-electric machine 1 provided with the power device unit 4 as described above, a DC power is supplied to the power device unit 4 via the DC wirings 8 from the battery 5 when the engine is started. Then, the control circuit 44 turns ON and OFF the respective semiconductor switching devices 41a1, 41an, 41b1 and 41bn in the respective UVW phases in the inverter bridge 40, whereby the DC power is converted to a three-phase AC power. Then, the three-phase AC power is supplied to the armature winding 16a of the dynamo-electric machine 1 via the AC wirings 9. Accordingly, a revolving magnetic field is provided in the peripheral of the field wiring 14 of the rotor to which the field current is supplied from the field current control circuit 45, so that the rotor of the dynamo-electric machine 1 is driven to rotate, whereby the engine is started via a dynamo-electric machine pulley, a belt, a crank pulley and a clutch (on).

On the other hand, when the engine is started, the revolving power of the engine is transmitted to the dynamo-electric machine 1 via the crank pulley, the belt, and the dynamo-electric machine pulley. Accordingly, the rotor of the dynamo-electric machine 1 is driven to rotate, whereby a three-phase AC voltage is induced by the armature winding 16a. Therefore, the control circuit 44 turns ON and OFF the respective semiconductor switching devices 41a1, 41an, 41b1, 41bn of the respective phases, converts the three-phase AC power induced by the armature winding 16a to the DC power to charge the battery 5 with the DC power.

Figure 2:
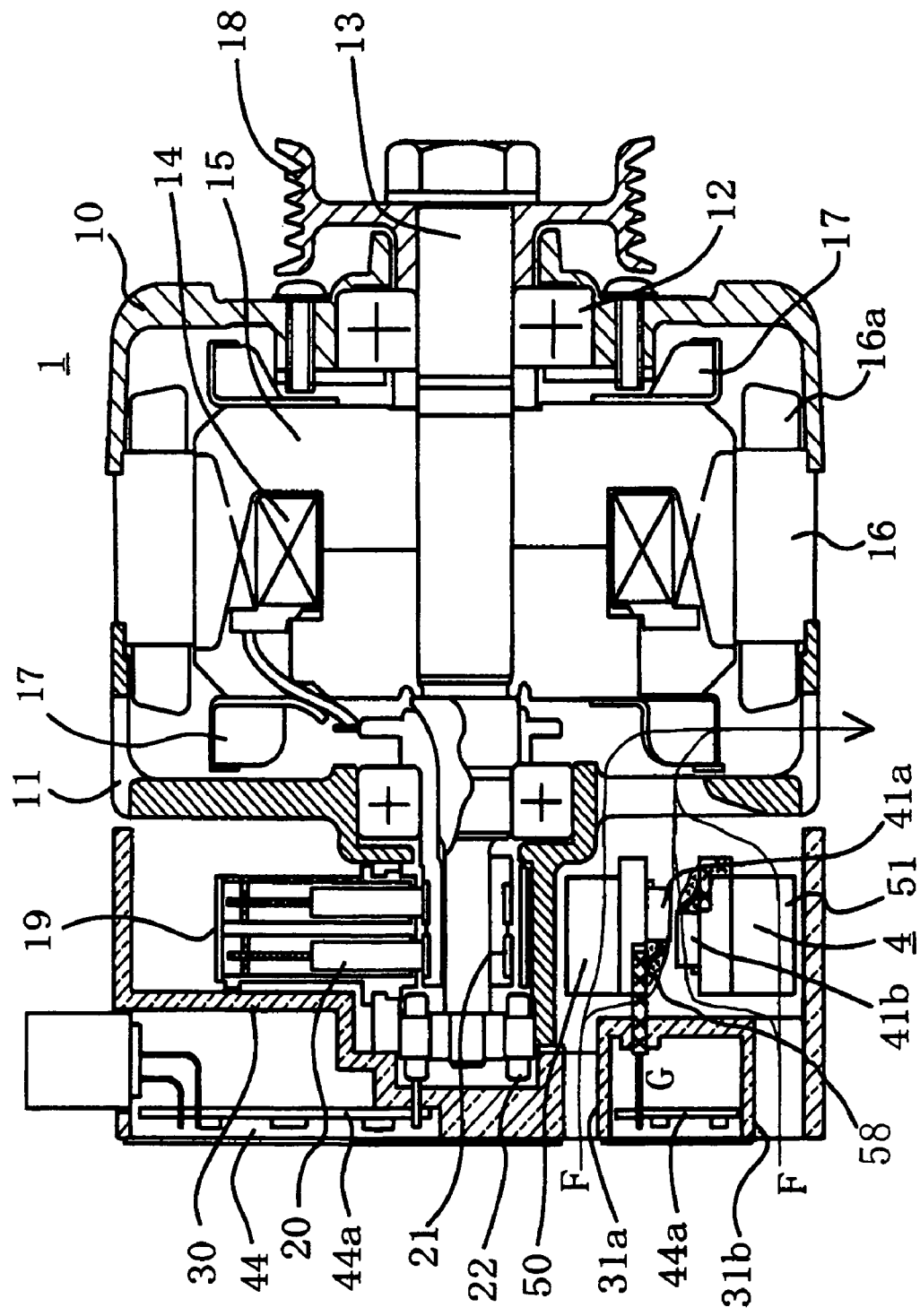
FIG. 2 is a vertical cross-sectional side view of an example of the control device integrated dynamo-electric machine according to the first embodiment of the invention.
Figure 3:
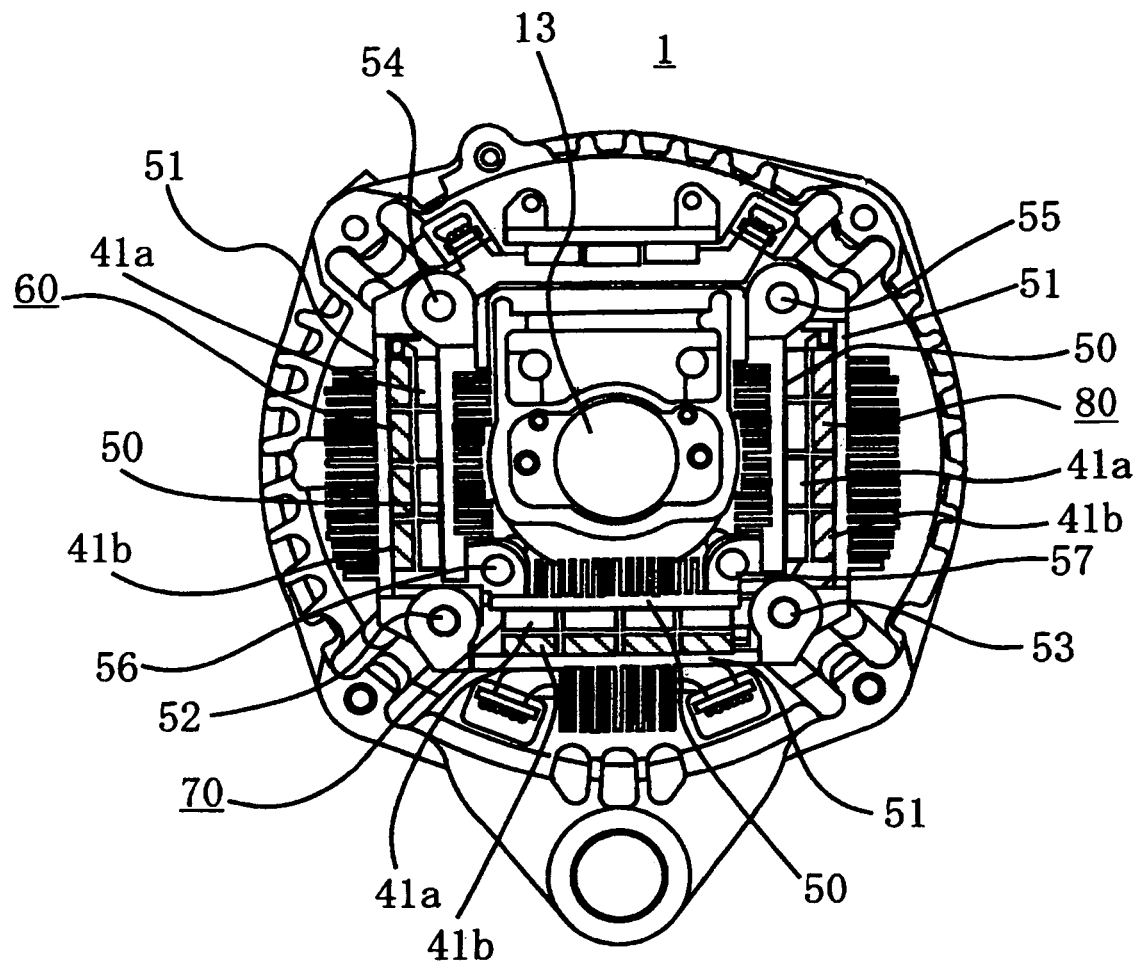
FIG. 3 is a front view of the power device unit according to the example of the control device integrated dynamo-electric machine in the first embodiment of the invention.
Figure 4:
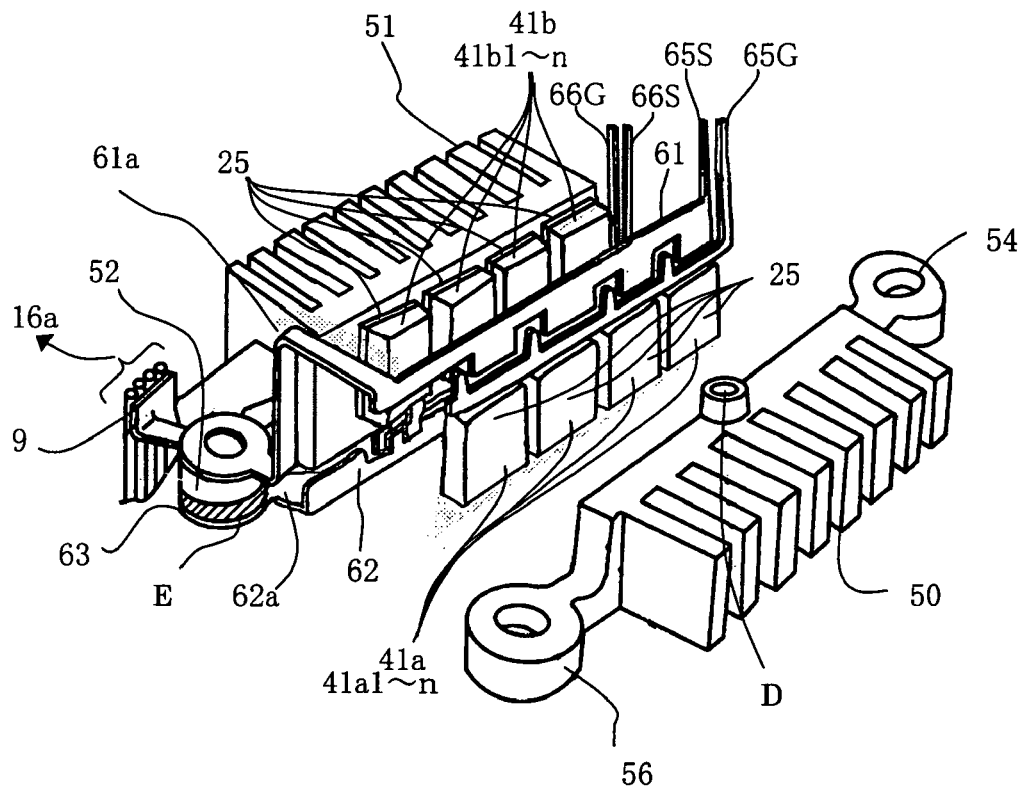
FIG. 4 is an assembly drawing showing a power unit in the exploded state according to the example of the control device integrated dynamo-electric machine in the first embodiment of the invention.

Referring now to FIG. 2 to FIG. 4 showing an example of a detailed structure of the control device integrated dynamo-electric machine, the detailed structure will be mainly described.

As shown in FIG. 2, the dynamo-electric machine 1 includes a case having a front bracket 10 and a rear bracket 11, a shaft 13 disposed in the case via a supporting bearing 12 so as to be capable of rotating, a rotor 15 fixed to the shaft 13 and having the field winding 14, a stator 16 fixed to the case so as to surround the rotor 15 and having the armature winding 16a, a fan 17 fixed to both end surfaces in the axial direction of the rotor 15, a pulley 18 secured to an end of the shaft 13 on the front side, a brush holder 19 mounted to the rear bracket 11 so as to be positioned on the outer periphery of the rear side of the shaft 13, a pair of brushes 20 disposed in the brush holder 19 so as to be brought into sliding contact with a pair of slip rings 21 mounted to the rear side of the shaft 13, and a rotational position detecting sensor (resolver, and the like) 22 disposed at an end of the shaft 13 on the rear side.

The dynamo-electric machine 1 is connected to a revolving shaft (not shown) of the engine via the pulley 18 and a belt (not shown).

In the first embodiment, the power device unit 4 is disposed integrally or in the vicinity of the dynamo-electric machine 1. In other word, the plurality of semiconductor switching elements 41a, 41b, an inner heat sink 50 and an outer heat sink 51 connected to the respective semiconductor switching elements 41, which constitute the power device unit 4, are installed on the outer surface of the rear bracket 11 via a supporting member (not shown) in a space defined between a cover 30 disposed on the rear side of the rear bracket 11 and the rear bracket 11. A control circuit board 44a on which the control circuit 44 is mounted is disposed on the outside of the cover 30. The control circuit board 44a having the control circuit 44 mounted thereon is integrally mounted to the dynamo-electric machine 1 via the cover 30. Although the control circuit board 44a having the above described control circuit 44 mounted thereon is mounted directly and integrally to the dynamo-electric machine 1 via the cover 30 in many cases, it may be mounted integrally indirectly via a part of a vehicle body.

The cover 30 and the rear bracket 11 are formed with air ventilation holes 31a, 31b to form an air passage as indicated by an arrow F in the drawing, whereby air passes through the cover 30 by the rotation of the fan 17 of the rotor 15 to cool the semiconductor switching elements 41a, 41b, the inner heat sink 50, the outer heat sink 51, the control circuit 44 on the control circuit board 44a.

As shown in FIG. 3, the power device unit 4 is divided into three-phase portions of U, V and W (a U-phase portion 60, a V-phase portion 70 and a W-phase portion 80), a pair of heat sinks, that is, the inner heat sink 50 and the outer heat sink 51 are mounted to each portion. The semiconductor switching element 41a (void portion in the drawing) of the upper arm is mounted to the inner heat sink 50, and the semiconductor switching elements 41a each include the four (that is, plural) semiconductor switching devices 41a1, . . . 41an arranged in parallel circumferentially of the dynamo-electric machine 1 and in parallel in terms of the configuration of the circuit as shown in the drawing. In the same manner, the semiconductor switching elements 41b (hatched in the drawing) of the lower arm are mounted to the outer heat sink 51, and the semiconductor switching elements 41b each include the four (that is, plural) semiconductor switching devices 41b1, . . . 41bn arranged in parallel circumferentially of the dynamo-electric machine 1 in parallel in terms of the configuration of the circuit as shown in the drawing.

The U-phase portion 60, the V-phase portion 70 and the W-phase portion 80 are positioned around the revolving shaft 13 of the dynamo-electric machine 1 at the radially same distance from the revolving shaft 13 so as to surround the revolving shaft 13 as shown in the drawing, and these portions are positioned on a same plane which is orthogonal to the revolving shaft 13.

In other words, the inner heat sink 50, the outer heat sink 51 and the semiconductor switching elements 41a and 41b of the U-phase portion 60, the inner heat sink 50, the outer heat sink 51 and the semi-conductor switching elements 41a and 41b of the V-phase portion 70, and the inner heat sink 50, the outer heat sink 51 and the semiconductor switching elements 41a, 41b of the W-phase portion 80 are positioned at the radially same distance from the revolving shaft 13 around the revolving shaft 13 so as to surround the revolving shaft 13 of the dynamo-electric machine 1 as shown in the drawing, and are positioned on the same plane which is orthogonal to the revolving shaft 13.

Referring now to FIG. 4, which is an exploded perspective view showing an assembly of a power unit, detailed layout of the semiconductor switching elements 41a, 41b, the inner heat sink 50, the outer heat sink 51 and the power unit wiring structure will be described referring also to the schematic circuit diagram in FIG. 1.

Firstly, the semiconductor switching elements 41a which constitute the upper arm 46 include four MOSFETs (semiconductor switching devices) 41a1 to 41an bonded to the inner heat sink 50 via base plates 25 which serve as drain terminals D (see also FIG. 1) with an electrically conductive member and a heat conductive member such as solder.

On the other hand, the semiconductor switching elements 41b which constitute the lower arm 47 also include four MOSFETs 41b1 to 41bn bonded to the outer heat sink 51 via the base plates 25 which also serve as the drain terminals D (see also FIG. 1) with the electrically conductive member and the heat conductive member such as the solder.

Accordingly, the respective heat sinks have the same potential as the respective drain terminals D bonded correspondingly.

A source terminal 65S (see also S in FIG. 1) of the semiconductor switching devices 41a1 to 41an (the semiconductor switching elements 41a) is led in common from the four semiconductor switching devices 41a1 to 41an by a wiring plate 61, one end of which is connected in common to the outer heat sink 51 of a lower arm 47, that is, to the drain terminal D (see also D in FIG. 1) of the semiconductor switching element 41b via a bridged wiring layer 61a, and also connected to the U-phase lead wire of the armature winding 16a of the stator 16 via the AC wiring 9. A gate terminal 65G of the semiconductor switching devices 41a1 to 41an (semiconductor switching element 41a) is also led in common from the four semiconductor switching devices 41a1 to 41an in the same manner as the source terminal 65S. In addition, the source terminal 65S and the gate terminal 65G are led in pair so as to be convenient for switching between the corresponding semiconductor switching devices 41a1 to 41an.

A source terminal 66S (see also S in FIG. 1) of the semiconductor switching devices 41b1 to 41bn (the semiconductor switching elements 41b) is led in common from the four semiconductor switching devices 41b1 to 41bn by the wiring plate 62, one end of which is extended to a common fixing portion 52 and connected in common to the outer heat sink 51 via an extended wiring layer 62a, and is secured in common to the U-phase heat sink 51 together with the bridged wiring layer 61a of the U-phase wiring plate 61, and is also grounded E through an earth member (bracket or the like) in itself. A gate terminal 66G of the semiconductor switching devices 41b1 to 41bn is led in common from the four semiconductor switching devices 41b1 to 41bn in the same manner as the source terminal 66S. In addition, the source terminal 66S and the gate terminal 66G are led in pair so as to be convenient for switching between the corresponding semiconductor switching devices 41b1 to 41bn.

In FIG. 4, the source terminal S and the gate terminal G are shown only on one of the semiconductor switching devices 41b1 to 41bn in the semiconductor switching element 41b, and the source terminals and the gate terminals for the remaining elements are omitted for showing the wiring structure clearly. In the same manner, also in FIG. 5 to FIG. 7, the source terminal S and the gate terminal G are shown only on one of the semiconductor switching devices 41b1 to 41bn of the semiconductor switching element 41b, and the source terminals and the gate terminals for the remaining elements are omitted for showing the wiring structure clearly. The source terminal S and the gate terminal G of the semiconductor switching elements 41a, that is, of the respective semiconductor switching devices 41a1 to 41an, and of the semiconductor switching elements 41b, that is, the semiconductor switching devices 41b1 to 41bn are, as shown in FIG. 2, provided with insulations 58 such as resin insulations or the like. The insulations 58 are provided for insulating between the source terminal S and the gate terminal G and insulating between these terminals and the drain terminals D or the heat sinks 50, 51. The insulation 58 is not shown in FIG. 4 to FIG. 9.

In this manner, the first embodiment of the invention achieves downsizing and cost reduction of the power unit (inverter bridge unit) by connecting the plurality of semiconductor switching devices, which have a small current capacity and hence are low cost, in parallel.

Furthermore, by employing the configuration in which the plurality of semiconductor switching devices are arranged in parallel, the plurality of devices can be dispersed on the heat sinks which dissipate heat generated from the semiconductor switching devices, and hence the heat dissipation performance can be improved in comparison with the related art.

Furthermore, since the plurality of semiconductor switching devices are arranged in parallel, even when some of the plurality of semiconductor switching devices are failed, the operation can be continued by other normal semiconductor switching devices although the performance is lowered.

Still further, the base plates which serve as the drain terminals of the semiconductor switching devices are connected to the heat sinks directly, the heat resistance between the semiconductor switching devices and the heat sinks can be reduced in comparison with the case of mounting the semiconductor switching devices, for example, to a metal substrate, and mounting the metal substrate to the heat sink for the heat dissipation. Therefore, the semiconductor switching devices can be cooled effectively, and hence improvement of the output or usage in the environment at high temperature is enabled.

In other words, the first embodiment of the invention is the control device integrated dynamo-electric machine including the inverter bridge having the plurality of semiconductor switching elements and the plurality of heat sinks that are provided for respective arms of the inverter bridge and include the semiconductor switching elements mounted thereto for the corresponding arms for cooling the semiconductor switching elements mounted thereto, the plurality of semiconductor switching elements and the plurality of heat sinks being mounted to the control device integrated dynamo-electric machine, wherein the semiconductor switching elements include the plurality of semiconductor switching devices arranged in parallel, the plurality of semiconductor switching devices arranged in parallel are mounted to the common heat sinks. Therefore, in this arrangement, by using in parallel the switching devices having a small current capacity, which are widely available in moderate price, the power circuit can be configured at a lower cost than the case of using a single switching device having a large current capacity. By employing the configuration in which the plurality of semiconductor switching devices are connected in parallel, the semiconductor switching devices can be dispersed on the heat sinks. Therefore, the heat dissipation efficiency of the heat sink can be improved in comparison with the case of using the single semiconductor switching device, and is effective for decreasing the temperature of the semiconductor switching devices. Furthermore, the plurality of semiconductor switching devices are provided, even though some of the semiconductor switching devices fail and cannot function any longer, the function can be continued by the remaining semiconductor switching devices although the performance is limited, it is effective as a fail-safe structure.

In addition, as shown in the drawings, since the plurality of semiconductor switching devices which constitute the high potential arm and the plurality of semiconductor switching devices which constitute the low potential arm on the same phase are arranged in parallel radially of the dynamo-electric machine, since the plurality of semiconductor switching devices which constitute the high potential arm and the plurality of semiconductor switching devices which constitute the low potential arm arranged in parallel are arranged so as to oppose to each other radially of the dynamo-electric machine and the respective heat sinks are disposed on the back side of the corresponding semiconductor switching devices, and since the cooling air is generated by the rotation of the dynamo-electric machine, the semiconductor switching devices can be cooled directly and effectively.

The plurality of semiconductor switching devices in the respective arms are apart from each other in the circumferential direction of the dynamo-electric machine from each other, and the cooling air generated by the rotation of the dynamo-electric machine flows in the direction of extension of the revolving shaft of the dynamo-electric machine around the semiconductor switching devices and the heat sinks. In this configuration, the flow of the cooling air around the semiconductor switching devices can be rectified, and hence the semiconductor switching devices can be cooled directly and effectively.

Since the plurality of semiconductor switching devices which constitute the high potential arm and the plurality of semiconductor switching devices which constitute the low potential arm arranged in parallel are arranged substantially at the same positions in the circumferential direction of the dynamo-electric machine, the flow of the cooling air around the semiconductor switching devices can be rectified, and the semiconductor switching devices can be cooled directly and effectively.

Second Embodiment

Figure 5:
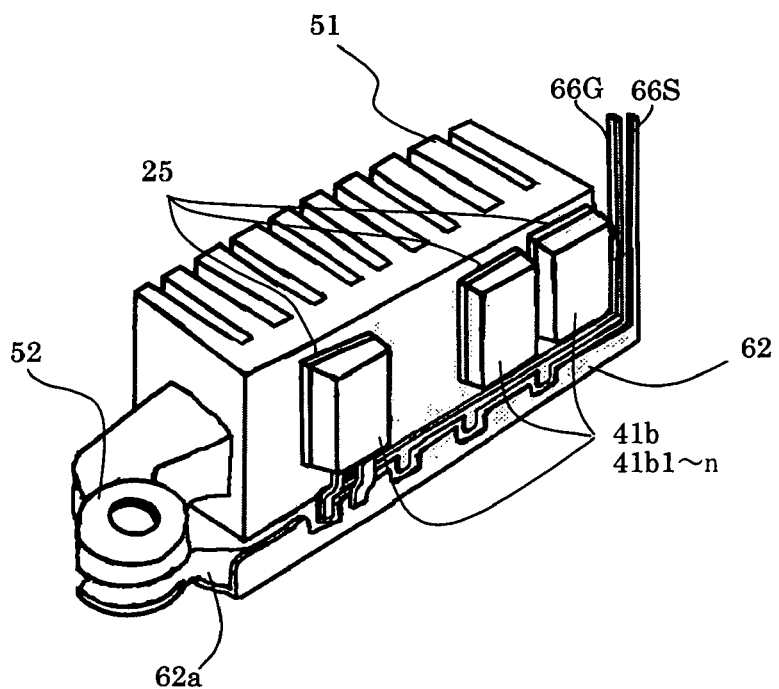
FIG. 5 is a perspective view showing an example of one of arms (low-potential arm) of the power unit (inverter unit) according to an example of the control device integrated dynamo-electric machine in a second embodiment of the invention.

Referring now to FIG. 5, a second embodiment of the invention will be described. In FIG. 5, the same or corresponding parts as/to those in FIG. 1 to FIG. 4 described above are represented by the same reference numerals, and the parts substantially different from those in FIG. 1 to FIG. 4 are mainly described, and description of other parts is omitted.

The second embodiment is an example of being applied to a vehicle which requires smaller torque during power running in comparison with the first embodiment (FIG. 1 to FIG. 4) described above. As is understood by comparing with FIG. 4 shown above, in the configuration in FIG. 5, the number of the semiconductor switching devices of the semiconductor switching element 41b is smaller than that in FIG. 4 by one.

In this manner, with the configuration in which the semiconductor switching elements 41a, 41b which constitute the upper and lower arms of the respective phases of the inverter bridge 40 include the plurality of semiconductor switching devices 41a1 to 41an connected in parallel via the heat sinks 50, 51, the number of the semiconductor switching devices can be reduced according to the requirement, such as the required torque, without changing the structure of the heat sinks 50, 51 and of the portion in the vicinity thereof, so that the control device integrated dynamo-electric machine with a higher reliability can be achieved and provided easily at low cost. In other words, only by reducing or increasing the number of the semiconductor switching devices by one, the heat sinks or wiring members can be used without any modification, and hence a new part is not necessary. Therefore, the parts can be standardized, and hence the control device integrated dynamo-electric machine with a higher reliability can be achieved and provided easily at low cost.

In addition, when reducing the number of the semiconductor switching devices, the current capacity required during the power running is considered. Although the maximum current flows only for a short time during the power running, it is preferable to determine the number of the semiconductor switching devices connected in parallel considering the maximum current flowing during the power running in order to increase the reliability of the semiconductor switching device. When the maximum current flows for a short time during the power running, there exists a transient state for a short time. In this case, in view of heat generation or heat dissipation, it can be ignored more or less, and hence it depends little to cooling property of the heat sinks to which the semiconductor switching devices are mounted. Therefore, it is not specifically necessary to consider the cooling property of the heat sink.

In addition, in the current capacity described above, the summation of the power running temperature increase value (the temperature increase value during the power running) and the saturation temperature at the time of continuous power generation (at the time of continuous power generation in the dynamo-electric machine 1) does not exceed the allowable temperature of the semiconductor switching device. In this setting, as regards the saturation temperature at the time of continuous power generation, the amount of heat generation for one semiconductor switching device is increased by reducing the number of the semiconductor switching devices arranged in parallel, but the surface area of the heat sink (heat dissipation surface area) for one semiconductor switching device is increased, and hence the cooling property is increased. Consequently, the capability of the semiconductor switching devices can be used effectively including during the power running.

When the size of the heat sink can be increased or when the size of the fan can be increased, the increasing value of the saturation temperature at the time of continuous power generation can be held down because of the structure of the dynamo-electric machine. Therefore, it is also possible to reduce the number of parallel arrangement so that the summation of the temperature increase value and the temperature increase value during the power running does not exceed the allowable temperature of the semiconductor switching device.

In this manner, by arranging the semiconductor switching devices in parallel and setting the number of the semiconductor switching devices arranged in parallel while considering the temperature increase value for the power generation and the power running, the dynamo-electric machine with high design flexibility can be achieved.

In the case of the control device integrated dynamo-electric machine as in this application, the cooling operation by the fan is stopped when the operation of the dynamo-electric machine is stopped for the idling stop after having generated the power, and the temperature of the semiconductor switching devices may increase due to the thermal effect from the stator or the rotor of the dynamo-electric machine. In this case, by determining the number of the semiconductor switching devices arranged in parallel or the design of cooling function to achieve the temperature of the semiconductor switching devices not exceeding the allowable temperature by considering the temperature increase of the semiconductor switching devices after having stopped in addition to the temperature increase value during the power generation and the power running, thermal safety for the semiconductor switching devices can be increased.

Third Embodiment

Figure 6:
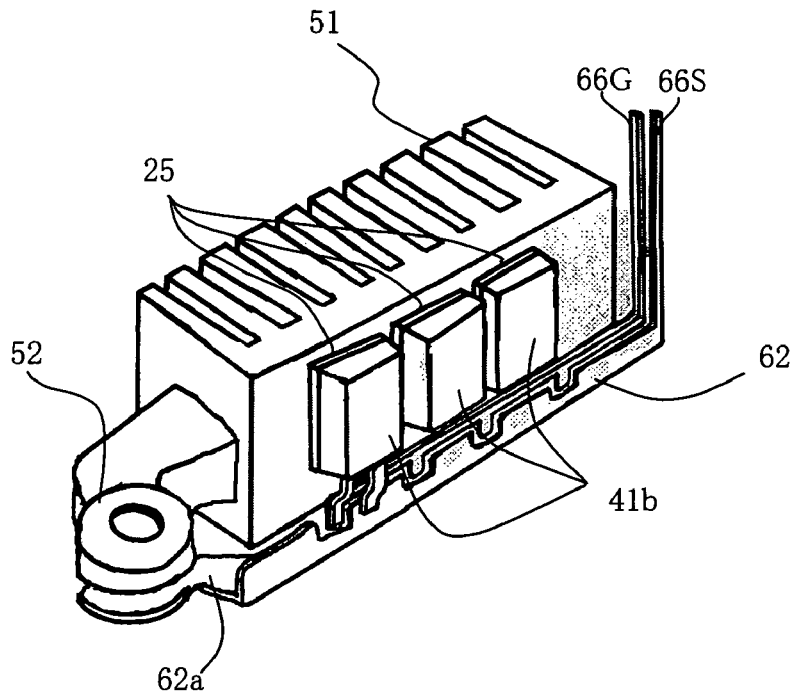
FIG. 6 is a perspective view showing another example of the one of the arms (low-potential arm) of the power unit (inverter unit) according to an example of the control device integrated dynamo-electric machine in a third embodiment of the invention.

Referring now to FIG. 6, a third embodiment of the invention will be described. In FIG. 6, the same or corresponding parts as/to those in FIG. 1 to FIG. 5 described above are represented by the same reference numerals, and the parts substantially different from those in FIG. 1 to FIG. 5 are mainly described, and description of other parts is omitted.

As is understood from the structure shown in FIG. 6, the third embodiment has a structure in which the number of the semiconductor switching devices $41a1$ to $41an$, $41b1$ to $41bn$ ($41a1$ to $41an$ are not shown) is reduced by one according to the current capacity required for the control device integrated dynamo-electric machine in the same manner as the second embodiment of the invention. However, the positions of arrangement of the semiconductor switching devices on the heat sinks 50, 51 (50 is not shown) are concentrated to the side where the output line is led (the side closer to the common fixing portion 52 adjacent to the AC wiring 9).

In this arrangement, the wiring resistance can be reduced, and hence heat generation due to the wiring resistance can be reduced. Therefore, the amount of heat dissipated from the heat sink is reduced correspondingly, and hence the output improvement and the usage in the environment at a higher temperature are enabled correspondingly.

In this manner, by arranging the semiconductor switching devices in parallel and determining the number of semiconductor switching devices to be arranged in parallel or the design of cooling function while considering the positions of arrangement of the semiconductor switching devices, the dynamo-electric machine having higher flexibility in design and achieving higher thermal safety is provided.

Fourth Embodiment

Figure 7:
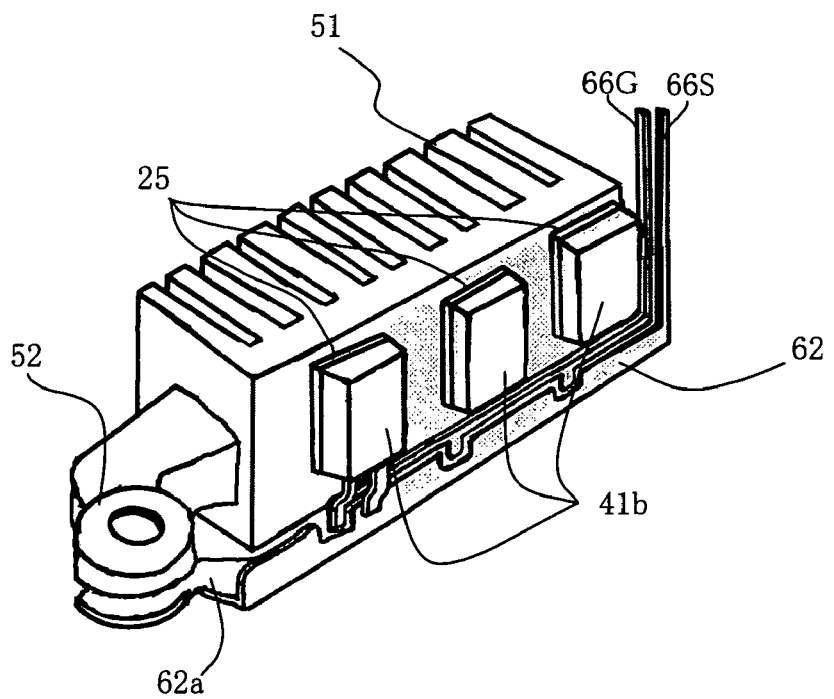
FIG. 7 is a perspective view showing still another example of the one of the arms (low-potential arm) of the power unit (inverter unit) according to an example of the control device integrated dynamo-electric machine in a fourth embodiment of the invention.

Referring now to FIG. 7, a fourth embodiment of the invention will be described. In FIG. 7, the same or corresponding parts as/to those in FIG. 1 to FIG. 6 described above are represented by the same reference numerals, and the parts substantially different from those in FIG. 1 to FIG. 6 are mainly described, and description of other parts is omitted.

As is understood from the structure shown in FIG. 7, the fourth embodiment has a structure in which the number of the semiconductor switching devices $41a1$ to $41an$, $41b1$ to $41bn$ ($41a1$ to $41an$ are not shown) is reduced by one according to the current capacity required for the control device integrated dynamo-electric machine, for example, in the same manner as the second and third embodiments of the invention. However, the positions of arrangement of the semiconductor switching devices on the heat sinks 50, 51 (50 is not shown) is dispersed over the entire surface thereof on the side where the semiconductor switching devices are mounted.

In this arrangement, heat from the semiconductor switching devices can be dispersed and dissipated to the heat sinks, and hence the temperature distribution on the heat sink is reduced, so that the heat dissipation capability of the heat sinks can be demonstrated sufficiently. In addition, the temperature difference of the semiconductor switching devices connected in parallel can be reduced, and hence the temperature deviation is small. Therefore, there remains a larger additional coverage to the upper limit temperature for the usage of the semiconductor switching devices, and hence the output improvement and the usage in the environment at a higher temperature are enabled correspondingly.

In this manner, by arranging the semiconductor switching devices in parallel and determining the number of semiconductor switching devices to be arranged in parallel or the design of cooling function while considering the positions of arrangement of the semiconductor switching devices as the third embodiment, the dynamo-electric machine having higher flexibility in design and achieving higher thermal safety is provided.

Fifth Embodiment

Figure 8:
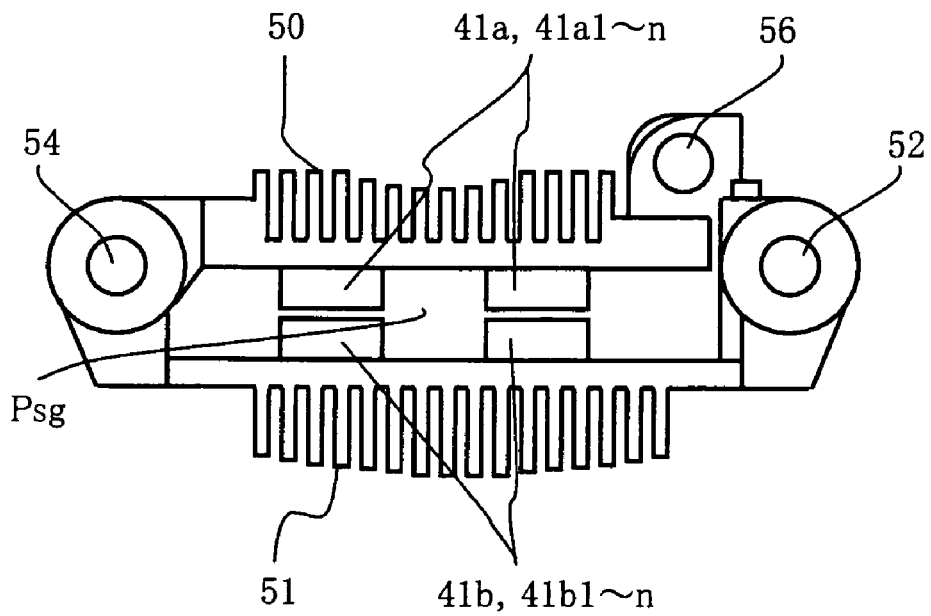
FIG. 8 is a front view showing another example of the a power unit (inverter unit) of one phase according to an example of the control device integrated dynamo-electric machine in a fifth embodiment of the invention.

Referring now to FIG. 8, a fifth embodiment of the invention will be described. In FIG. 8, the same or corresponding parts as/to those in FIG. 1 to FIG. 7 described above are represented by the same reference numerals, and the parts substantially different from those in FIG. 1 to FIG. 7 are mainly described, and description of other parts is omitted.

As is understood from the structure shown in FIG. 8, the fifth embodiment has a structure in which the number of the semiconductor switching devices $41a1$ to $41an$, $41b1$ to $41bn$ ($41a1$ to $41an$ are not shown) is reduced by two according to the current capacity required for the control device integrated dynamo-electric machine, for example, in comparison with the first embodiment of the invention described above, and the semiconductor switching devices are arranged on the heat sinks 50, 51 of the upper and lower arms at positions exactly opposing to each other radially of the dynamo-electric machine 1 without being shifted circumferentially of the dynamo-electric machine 1 from each other.

In this arrangement, since the cooling air flowing between the both heat sinks passes through a space Psg between the semiconductor switching devices and hence the flow of the cooling air around the semiconductor switching devices can be rectified. Therefore, the semiconductor switching devices and the inner surfaces of the heat sinks can be cooled directly and effectively. In this manner, since the temperature of the semiconductor switching devices can be reduced effectively, the output improvement and the usage in the environment at a higher temperature are enabled correspondingly.

In this manner, by arranging the semiconductor switching devices in parallel and determining the positions of arrangement of the semiconductor switching devices are set while considering the cooling property of the entire power unit including the heat sinks, the dynamo-electric machine having higher flexibility in design and achieving higher thermal safety is provided.

Sixth Embodiment

Figure 9:
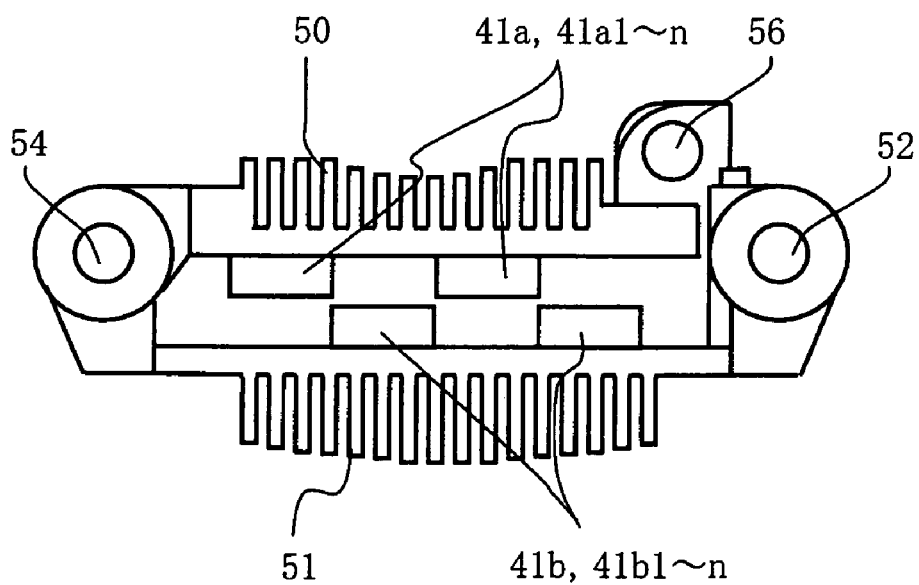
FIG. 9 is a front view showing still another example of the power unit (inverter unit) of one phase according to an example of the control device integrated dynamo-electric machine in a sixth embodiment of the invention.

Referring now to FIG. 9, a sixth embodiment will be described. FIG. 9 is a front view showing another example of the power unit (inverter unit) of one phase in the example of the control device integrated dynamo-electric machine. The same or corresponding parts as/to those in FIG. 1 to FIG. 8 described above are represented by the same reference numerals, and the parts substantially different from those in FIG. 1 to FIG. 8 are mainly described, and description of other parts is omitted.

As is understood from the structure shown in FIG. 9, the sixth embodiment has a structure in which the number of the semiconductor switching devices 41a1 to 41an, 41b1 to 41bn (41a1 to 41an are not shown) is reduced by two according to the current capacity required for the control device integrated dynamo-electric machine, for example, in comparison with FIG. 2 described above, and the semiconductor switching devices are arranged on the heat sinks 50, 51 of the upper and lower arms at positions shifted circumferentially of the dynamo-electric machine 1 instead of being exactly opposed to each other radially of the dynamo-electric machine 1.

In this arrangement, the cooling air flowing between the both heat sinks flows dispersedly in the space between the semiconductor switching devices and the heat sinks, and hence the flowing resistance of the cooling air around the semiconductor switching devices can be reduced, and hence the amount of flowing air is increased consequently. Therefore, the respective semiconductor switching devices and the inner surfaces of the heat sinks can be cooled directly and effectively. In this manner, since the temperature of the semiconductor switching devices can be reduced effectively, the output improvement and the usage in the environment at a higher temperature are enabled correspondingly.

In this manner, by arranging the semiconductor switching devices in parallel and determining the positions of arrangement of the semiconductor switching devices are set while considering the cooling property of the entire power unit including the heat sinks as in the fifth embodiment, the dynamo-electric machine having higher flexibility in design and achieving higher thermal safety is provided.

As described above, the first to sixth embodiments of the invention has commonly observed advantages that the reliability, cost performance and the cooling property can be improved, and that the size, the cooling property, and the cost can be optimized easily. In addition, cost reduction of the power unit can be achieved by arranging a plurality of the low-current-capacity semiconductor switching devices which are circulating in the market in a large quantity at low cost in parallel. In addition, with the configuration in which the plurality of semiconductor switching devices are arranged in parallel, the plurality of devices can be dispersed on the heat sinks which dissipate heat generated from the semiconductor switching devices, and hence the heat dissipation performance can be improved in comparison with the related art. In addition, since the plurality of the semiconductor switching devices are arranged in parallel, even when some of the plurality of semiconductor switching devices fail, the operation can be continued by other normal semiconductor switching devices even though the performance is lowered.

Various modifications and alterations of this invention will be apparent to those skilled in the art without departing from the scope and sprit of this invention, and it should be understood that this is not limited to the illustrative embodiments set forth herein.

What is claimed is:

1. A control device integrated dynamo-electric machine comprising:
    an inverter bridge having a plurality of semiconductor switching elements provided for respective arms thereof; and
    a plurality of common heat sinks that are provided for the respective arms of the inverter bridge and include the semiconductor switching elements mounted thereto for the corresponding arms for cooling the semiconductor switching elements mounted thereto, the plurality of semiconductor switching elements and the plurality of heat sinks being mounted to the control device integrated dynamo-electric machine,
    wherein each semiconductor switching element includes a plurality of semiconductor switching devices connected in parallel, and the plurality of semiconductor switching devices of a respective semiconductor switching element are mounted to a respective one of the common heat sinks and are spaced apart from each other, so that each semiconductor switching device is exposed to a cooling air pass within which cooling air generated by rotating of a revolving shaft of the dynamo-electric machine flows in a direction of extension of the revolving shaft and each semiconductor switching device is cooled directly by the cooling air.

2. The control device integrated dynamo-electric machine according to claim 1, wherein the plurality of semiconductor switching devices that constitute a high-potential arm and the plurality of semiconductor switching devices that constitute a low-potential arm in the same phase are arranged in parallel radially of the dynamo-electric machine.

3. The control device integrated dynamo-electric machine according to claim 2, wherein the plurality of semiconductor switching devices that constitute the high-potential arm and the plurality of semiconductor switching devices that constitute the low-potential arm arranged in parallel oppose to each other radially of the dynamo-electric machine, and the respective heat sinks are disposed on the back sides of the corresponding semiconductor switching devices.

4. The control device integrated dynamo-electric machine according to claim 3, wherein the plurality of semiconductor switching devices on the respective arms are apart from each other circumferentially of the dynamo-electric machine, and cooling air generated by rotation of the dynamo-electric machine flows around the semiconductor switching devices and the heat sinks in the direction of extension of a revolving shaft of the dynamo-electric machine.

5. The control device integrated dynamo-electric machine according to claim 2, wherein the plurality of semiconductor switching devices that constitute the high-potential arm and the plurality of semiconductor switching devices that constitute the low-potential arm arranged in parallel are arranged at substantially the same positions circumferentially of the dynamo-electric machine.

6. The control device integrated dynamo-electric machine according to claim 2, wherein the plurality of semiconductor switching devices that constitute the high-potential arm and the plurality of semiconductor switching devices that constitute the low-potential arm arranged in parallel are disposed at positions shifted circumferentially of the dynamo-electric machine.

7. The control device integrated dynamo-electric machine according to claim 1, wherein the number of the semiconductor switching devices arranged in parallel is determined according to a current capacity required for the inverter bridge.

8. The control device integrated dynamo-electric machine according to claim 7, wherein the current capacity is a current capacity required during power running.

9. The control device integrated dynamo-electric machine according to claim 1, wherein the number of the semiconductor switching devices arranged in parallel is a number such that the sum of the power running temperature increase value and the saturation temperature at the time of continuous power generation of the plurality of semiconductor switching devices arranged in parallel on the common heat sinks does not exceed the allowable temperature of the semiconductor switching device.

10. The control device integrated dynamo-electric machine according to claim 1, wherein the plurality of semiconductor switching devices mounted on the common heat sinks in parallel are positioned closer to the side where the output line is led on the heat sinks.

11. The control device integrated dynamo-electric machine according to claim 1, wherein the plurality of semiconductor switching devices mounted on the common heat sinks in parallel are positioned dispersedly on the heat sinks.

12. The control device integrated dynamo-electric machine according to claim 1, wherein the plurality of semiconductor switching devices mounted on the common heat sinks in parallel are connected integrally with the heat sinks with a heat conductive member.

13. The control device integrated dynamo-electric machine according to claim 1, wherein the plurality of semiconductor switching devices mounted on the common heat sinks in parallel are connected integrally with the heat sinks with an electrically conductive member.

14. The control device integrated dynamo-electric machine according to claim 1, wherein respective terminals of the respective semiconductor switching devices are provided with insulation for insulating between the terminals.

* * * * *